(12) United States Patent
Bachhuber et al.

(10) Patent No.: US 6,853,250 B2
(45) Date of Patent: Feb. 8, 2005

(54) AMPLIFIER POWER CONTROL CIRCUIT (75) Inventors: Stephen P. Bachhuber, Blacksburg, VA (US); Thomas R. Apel, Portland, OR (US); Robert E. Knapp, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/671,052

(22) Filed: Sep. 24, 2003

(65) Prior Publication Data

US 2004/0061557 A1 Apr. 1, 2004

Related U.S. Application Data (62) Division of application No. 10/234,614, filed on Sep. 3, 2002, now Pat. No. 6,653,902.

(51) Int. Cl.[7] ............................................... H03G 3/10
(52) U.S. Cl. ...................................... 330/285; 330/295
(58) Field of Search ................................ 330/285, 295, 330/124 R, 85, 296; 327/51

(56) References Cited

U.S. PATENT DOCUMENTS

| | | | | |
|---|---|---|---|---|
| 3,477,032 A | * | 11/1969 | Doner | ........................ 330/295 |
| 3,582,675 A | | 6/1971 | Jordan, Jr. | |
| 5,093,631 A | | 3/1992 | Benz et al. | |
| 6,580,258 B2 | | 6/2003 | Wilcox et al. | |
| 6,731,164 B2 | * | 5/2004 | Johnston | ........................ 330/85 |
| 6,750,721 B2 | * | 6/2004 | Patterson | ........................ 330/295 |
| 2003/0040343 A1 | | 2/2003 | Epperson et al. | |

FOREIGN PATENT DOCUMENTS

| | | |
|---|---|---|
| EP | 0161027 A2 | 11/1985 |
| EP | 0 896 439 A2 | 2/1999 |
| EP | 0 942 524 A2 | 9/1999 |
| EP | 1 154 566 A2 | 11/2001 |
| JP | 10065456 | 6/1998 |

* cited by examiner

*Primary Examiner*—Henry Choe
(74) *Attorney, Agent, or Firm*—Bever, Hoffman & Harms, LLP; E. Eric Hoffman (57) ABSTRACT

A sense transistor is placed in a current path between a reference voltage source and ground. The base terminal of the sense transistor is coupled to the base terminal of an amplifying transistor. Thus, current in the sense transistor corresponds to signal power output by the amplifying transistor. The sense current causes a sense voltage at the collector terminal of the sense transistor. This sense voltage is applied to one input of an error amplifier. The other error amplifier input receives a power control voltage. The error amplifier output is routed back to the base terminal of the amplifying transistor in a negative feedback loop, thereby keeping the power of the signal output by the amplifying transistor at a constant level. In some embodiments the error amplifier output is made independent of changes in the reference voltage. Multiple pairs of corresponding amplifying and sense transistors can be used.

19 Claims, 5 Drawing Sheets

AMPLIFIER POWER CONTROL CIRCUIT

RELATED APPLICATION

The present application is a divisional of U.S. patent application Ser. No. 10/234,614 filed by Stephen P. Bachhuber, Thomas R. Apel and Robert E. Knapp on Sep. 3, 2002 now U.S. Pat. No. 6,653,902.

BACKGROUND

1. Field of Invention

Embodiments relate to electronic amplifier output signal power detection and control, particularly for radio frequency (RF) signals output from one or more final stage amplifying transistors.

2. Related Art

Many electronic circuit applications require that output power of an amplifier be detected and controlled to maintain a specified level. Such an output power level may be required to change with time. In a Global System for Mobile communications (GSM) cellular telephone handset, for example, the final stage radio frequency (RF) amplifier outputs a signal to the antenna, and the power level of this signal must be controlled to maintain one or more precise levels. Therefore, it is important to be able to determine amplifier output power level and to control that power level.

The power of a signal output from a Class C or similar transistor amplifier with non-continuous conduction corresponds to the collector current. In such amplifiers, two or more transistors may be connected in parallel so that the signal output from the transistors corresponds to the combined collector currents. As is well-known for a bipolar junction transistor that operates in the cutoff or forward active region, the base current controls the collector current, and the collector current depends on the base-emitter voltage. Thus the base-emitter voltage is strongly correlated with the power of the signal output from the amplifier. It is therefore known that a desired output power level of an amplifying transistor can be maintained by sensing the output power and then adjusting the base bias voltage of the transistor to maintain the desired output power level.

One well-known method of sensing the power of an output signal from a transistor amplifier is to use a directional coupler. Such a directional coupler senses either forward or reflected signal power in a transmission line. A disadvantage of directional couplers, however, is that some coupling loss exists as the output signal is sampled. In addition, directional couplers are typically large, a condition which prevents the coupler from being on the same integrated circuit as the amplifier. Thus, additional area is required in an electronic device (e.g., a cellular telephone handset) to accommodate the coupler. Furthermore, adding an off-chip coupler to an electronic device increases the cost of the device.

What is desired is a way of sensing and controlling amplifier output signal power without significant loss, with little expense, and with little use of device area.

SUMMARY

In a power sensing and control circuit, the base terminal of a sense transistor is coupled to the base terminal of an amplifying transistor in, for example, the final stage of an RF amplifier. As a result, the sense current in the sense transistor corresponds to the current in the amplifying transistor. The sense current creates a sense voltage at a point along the current path that includes the sense transistor. The AC portion of the sense voltage is shunted to ground. The DC portion of the sense voltage is applied to one input of an error amplifier. A power control voltage is applied to the other input of the error amplifier, and the error amplifier outputs a voltage proportional to the difference (error) between the two input voltages. The error amplifier output is routed back to the base terminal of the amplifying transistor in a negative feedback loop, thereby controlling current in the amplifying transistor. Various combinations of amplifying and sense transistor pairs are included in various embodiments.

The sense transistor, and hence one input of the error amplifier, is coupled to a reference voltage supply. In some embodiments the output of the error amplifier will change as the reference voltage changes. In other embodiments, the output of the error amplifier is made independent of changes in the reference voltage.

Embodiments of the power control circuit offer several advantages, especially if formed on the same integrated circuit chip as the amplifier. In addition to being independent of the reference voltage (e.g., a power supply voltage) supplied to the chip, the power control circuit takes up only a small area on the chip. Further, cost is minimal since the power control circuit may be simultaneously fabricated with the amplifier and any associated on-chip circuits. Further, no output power is lost since the sense signal is taken from the input side of the amplifier. Such advantages are useful in, for example, cellular telephone handsets.

DETAILED DESCRIPTION

As described herein, error amplifiers are voltage amplifiers that amplify the voltage difference between a pair of inputs. Skilled individuals will be familiar with various error amplifier (operational amplifier) circuit topologies. For descriptive convenience, the error amplifier inputs are referred to as inverting (−) and non-inverting (+). Skilled individuals will understand that well-known circuit elements may have been omitted from one or more of the accompanying drawings so as to more clearly illustrate the embodiments.

Figure 1:
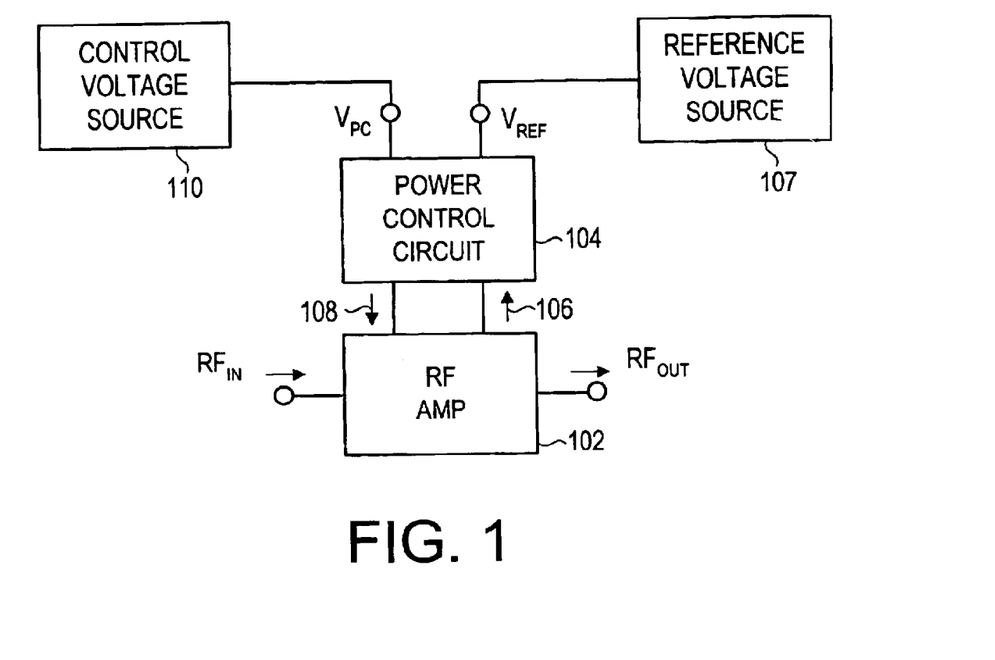
FIG. 1 is a diagrammatic view showing functional blocks in an amplifier and power control circuit combination.

FIG. 1 is a diagrammatic view showing functional blocks in an amplifier and power control circuit combination. As shown in FIG. 1, radio frequency (RF) amplifier 102 receives RF signal $RF_{IN}$, which in some instances is a modulated RF carrier at about 1–2 GigaHertz, although any AC signal frequency may be used. Amplifier 102 amplifies signal $RF_{IN}$ and outputs signal $RF_{OUT}$. In accordance with the invention, power control circuit 104 receives output power sense signal 106. The voltage in signal 106 corresponds to the power in signal $RF_{OUT}$.

Power control circuit 104 receives power supply voltage $V_{REF}$ from reference voltage source 107 (e.g., a battery and associated regulating circuits). Circuit 104 also receives power control voltage $V_{PC}$. In accordance with the invention, power control circuit 104 outputs base bias control signal 108 to RF amplifier 102. Base bias signal 108 controls the signal $RF_{OUT}$ power. The value of base bias signal 108 is determined by a combination of voltage $V_{PC}$ and power sense signal 106. Voltage $V_{PC}$ is supplied by control voltage source 110 which, in one embodiment, is a conventional digital-to-analog converter that outputs $V_{PC}$ in response to a received digital control signal programmed to specify a desired amplifier 102 output power level.

Embodiments of amplifier 102 and power control circuit 104 are formed on a single integrated circuit chip. In some embodiments, voltage $V_{REF}$ is supplied by a conventional voltage source outside the integrated circuit. Voltage $V_{PC}$ is held very steady at one or more particular values so as to precisely control the power of output signal $RF_{OUT}$. Other embodiments are formed such that power control circuit 104 (except a sense transistor shown and described below as transistor Q3) is formed on a second integrated circuit if fabricating a second integrated circuit makes such embodiments attractive (e.g., due to cost, size, etc.).

Figure 2:
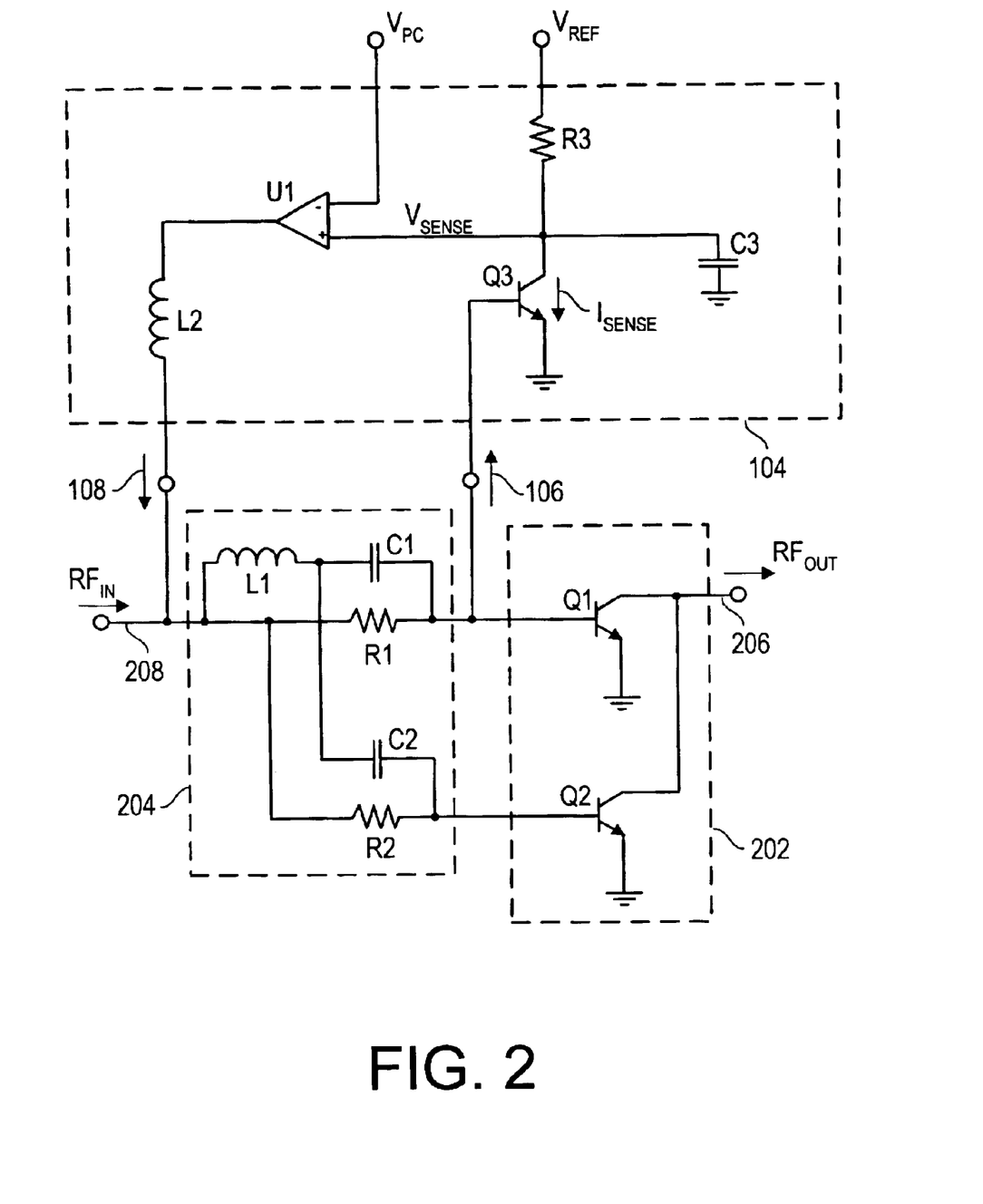
FIG. 2 is a schematic view showing an electrical circuit of an amplifier and a power control circuit.

FIG. 2 is a schematic view showing an electrical circuit formed, for example, on a single integrated circuit chip. In the embodiment shown in FIG. 2, amplifier 102 includes final amplifier circuit 202 and base ballast circuit 204, each outlined in dashed lines. The power control circuit 104 embodiment in FIG. 2 is also outlined in dashed lines.

As shown in FIG. 2, final amplifier circuit 202 includes two transistors Q1 and Q2, which are illustrative of one or more transistors that may be used. Transistors Q1,Q2 are further illustrative of various amplifying transistor configurations used, for example, as the final stage RF amplifier in cellular telephones. In one embodiment transistors Q1,Q2 are npn gallium arsenide (GaAs) heterojunction bipolar transistors (HBT), although other transistor materials and types may be used. For example, skilled individuals will be familiar with various final amplifier configurations using two or more transistor elements configured to counteract thermal gradients that exist in a single, larger transistor. Each unique transistor Q1,Q2 includes a collector. The collectors of each transistor Q1,Q2 are coupled together at node 206, at which the amplified signal $RF_{OUT}$ is output. The emitter of each unique transistor Q1,Q2 is coupled to ground. The base of each unique transistor Q1,Q2 receives a signal from base ballast circuit 204. Transistors Q1,Q2 are operated in the cutoff or forward active regions (e.g., Class C operation).

Base ballast circuit 204 receives at input node 208 the input signal $RF_{IN}$ to be amplified. One terminal of resistor R1 is coupled to node 208, and the other terminal of resistor R1 is coupled to the base terminal of transistor Q1. Similarly, one terminal of resistor R2 is coupled to node 208, and the other terminal of resistor R2 is coupled to the base terminal of transistor Q2. A DC signal is applied through resistors R1,R2 to the base terminals of transistors Q1,Q2, respectively, and skilled individuals understand that any increased voltage drop across resistors R1,R2 caused by increased current in the corresponding transistor Q1,Q2 causes the base voltage to drop, and hence controls current in the transistor. One terminal of capacitor C1 is coupled to the base terminal of transistor Q1, and likewise one terminal of capacitor C2 is coupled to the base terminal of transistor Q2. The other terminals of capacitors C1 and C2 are coupled together and to one terminal of inductor L1. The other terminal of inductor L1 is coupled to input node 208. The parallel-connected resistor and capacitor/shared inductor combination is repeated for each transistor in amplifier circuit 202. The resonant circuit formed by shared inductor L1 and parallel capacitors C1,C2 provides a low impedance at the signal $RF_{IN}$ frequency. Thus the DC component of signal $RF_{IN}$ passes through the resistors R1,R2, and the AC component of signal $RF_{IN}$ passes through the inductor L1 and capacitors C1,C2 combination. Details of this and other embodiments of base ballast circuit 204 are included in concurrently filed U.S. patent application Ser. No. 10/234,595 by Thomas R. Apel, entitled "Resonant Bypassed Base Ballast Circuit", and which is incorporated herein by reference. Other base ballast circuits may be used.

FIG. 2 further shows that power control circuit 104 includes sense transistor Q3. The base terminal of transistor Q3 is coupled to the base terminal of one of the transistors in amplifier circuit 202. The emitter terminal of transistor Q3 is coupled to ground. The collector terminal of transistor Q3 is coupled to ground via alternating current bypass capacitor C3, to the reference voltage source supplying voltage $V_{REF}$ via resistor R3, and to the non-inverting terminal of error amplifier U1. The inverting input of error amplifier U1 is coupled to the control voltage source and receives power control voltage $V_{PC}$. The error amplifier U1 output is coupled to one terminal of inductor L2. The other terminal of inductor L2 is coupled to input node 208.

Using inductor L2 has the advantage of providing a high impedance for the RF input signal received at node 208 and providing a low impedance for DC bias signal 108. An inductor, however, uses more chip area than a resistor. Therefore, in an alternate embodiment inductor L2 is replaced by a resistor, which provides the same impedance for DC and AC signals. In yet another embodiment, a smaller size inductor L2 is coupled in series with a resistor to take advantage of the benefits of both components. In still other embodiments, neither inductor L2 or a substitute resistor is used. It should be understood that the remarks in this paragraph also apply to other embodiments, such as those shown in FIGS. 3, 4, and 5

Base bias signal 108 is shown in FIG. 2 as being received at the same node that receives the RF input signal, but in other embodiments the nodes receiving base bias signal 108 and the RF input signal can be different, as long as base bias signal 108 reaches the base of the amplifying transistor whose base current is being sensed.

Since the base terminal of sense transistor Q3 is coupled to the base terminal of amplifying transistor Q1, the sense transistor Q3 collector current $I_{SENSE}$ is proportional to the signal $RF_{OUT}$ current. (That is, the ratio between $I_{SENSE}$ and the $RF_{OUT}$ current equals the ratio between the emitter area of the sense transistor and the emitter area(s) of the transistor(s) in amplifier 202. The emitter area of the sense transistor may be smaller than, equal to, or larger than the combined emitter areas of the one or more amplifying transistors in amplifier 202. In one illustrative embodiment, the emitter area of the sense transistor is about 360 times less than the combined emitter areas of final stage amplifying transistors in amplifier 202.) The AC voltage at the transistor Q3 collector is filtered to ground through AC bypass capacitor C3. Thus, the DC voltage $V_{SENSE}$, which depends on the voltage across resistor R3, is applied at the non-inverting input of error amplifier U1. Error amplifier U1 amplifies the difference between $V_{SENSE}$ and $V_{PC}$. Amplifier U1 outputs base bias signal 108 to input node 208, thereby adjusting the transistor Q1 base bias until $V_{SENSE}$ is substantially equal to $V_{PC}$. Inductor L2 blocks AC in signal 108.

Figure 3:
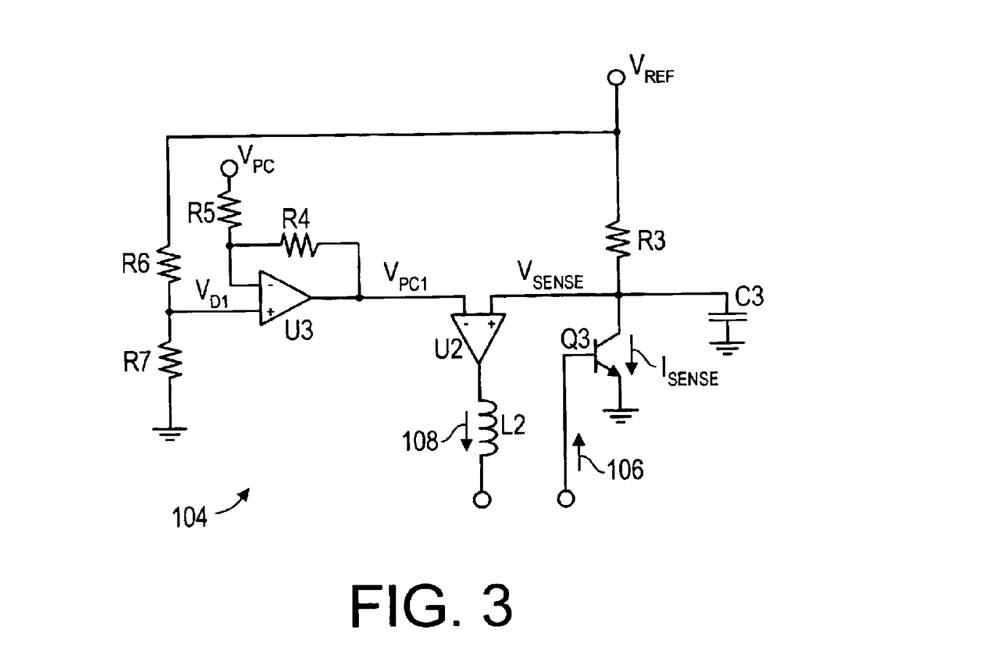
FIG. 3 is a schematic view showing an electrical circuit of a second power control circuit embodiment.

In the power control circuit 104 embodiment shown in FIG. 2, changes in voltage $V_{REF}$ result in changes in the signal $RF_{OUT}$ current. In some instances, however, it is desirable to make the signal $RF_{OUT}$ current independent of voltage $V_{REF}$, since $V_{REF}$ may not be as constant as desired. FIG. 3 is a schematic view showing an electrical circuit of a second power control circuit 104 embodiment in which the signal $RF_{OUT}$ current is independent of voltage $V_{REF}$.

As shown in FIG. 3, the base terminal of sense transistor Q3 is coupled to a base terminal of an amplifier 202 transistor as described with reference to FIG. 2. The emitter of transistor Q3 is coupled to ground. The collector of transistor Q3 is coupled to ground via capacitor C3, to the reference voltage supply via resistor R3, and to the non-inverting input of error amplifier U2. The inverting input of error amplifier U2 is coupled to the output of another error amplifier U3. The output of amplifier U3 is coupled via resistor R4 in a feedback loop to the inverting input of amplifier U3. The inverting input of amplifier U3 is also coupled via resistor R5 to the control voltage source outputting voltage $V_{PC}$. Resistors R6 and R7 are coupled in series between voltage $V_{REF}$ and ground, and the non-inverting input of amplifier U3 is connected to the voltage dividing node between resistors R6 and R7. The output terminal of error amplifier U2 is coupled to input node 208 and provides base bias control signal 108 to amplifier 102.

Sense voltage $V_{SENSE}$ is derived as described with reference to FIG. 2 and is applied to one amplifier U2 input terminal. Modified power control voltage $V_{PC1}$ is made to have a unity dependence on voltage $V_{REF}$ (e.g., if $V_{REF}$ increases 10 mV, $V_{PC1}$ increases 10 mV) and is applied to the second amplifier U2 input terminal. Amplifier U3 acts as an inverting amplifier that inverts around the voltage $V_{D1}$ between resistors R6 and R7. Resistors R4 and R5 are selected such that the gain of amplifier U3 is the inverse of $V_{D1}$ divided by $V_{REF}$ (i.e., R4/R5=R6/R7). Since $V_{PC1}$ and $V_{SENSE}$ vary proportionally with $V_{REF}$, amplifier U2 does not receive a difference signal originating with $V_{REF}$. Consequently, base bias control signal 108 is independent of voltage $V_{REF}$. The current sourced by the power control voltage $V_{PC}$ source (FIG. 1) is made small by making resistors R4 and R5 large.

Figure 4:
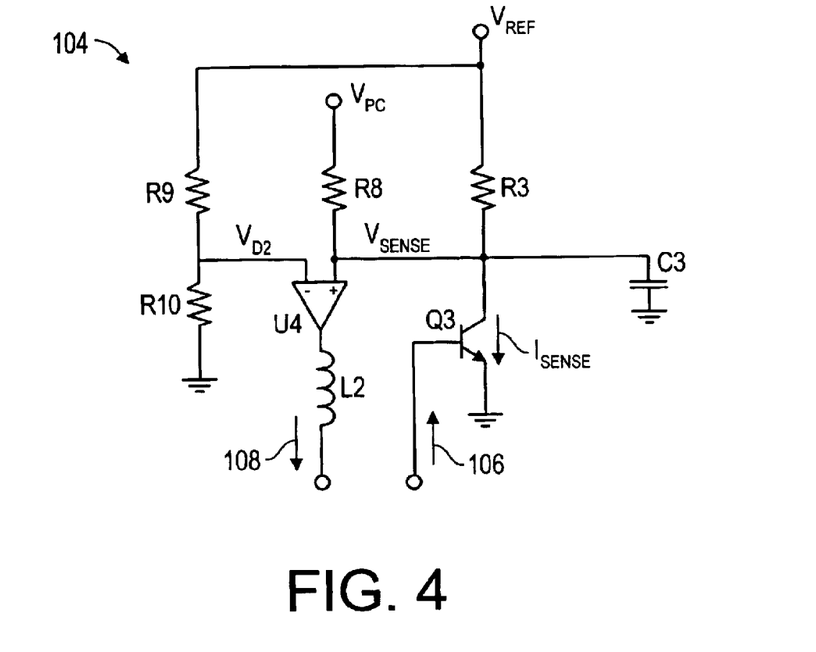
FIG. 4 is a schematic view showing an electrical circuit of a third power control circuit embodiment.

FIG. 4 is a schematic view showing an electrical circuit of a third power control circuit 104 embodiment in which the signal $RF_{OUT}$ current is independent of voltage $V_{REF}$. The base terminal of sense transistor Q3 is coupled to a base terminal of an amplifier 202 transistor as described with reference to FIG. 2. The emitter of transistor Q3 is coupled to ground. The collector of transistor Q3 is coupled to ground via capacitor C3, to the reference voltage supply via resistor R3, and to the non-inverting input of error amplifier U4. The non-inverting input of amplifier U4 is also coupled to power control voltage source via resistor R8. Resistors R9 and R10 are coupled in series between the reference voltage source and ground. The inverting input of amplifier U4 is coupled to the voltage dividing node between resistors R9 and R10. The output of amplifier U4 is coupled to input node 208 and provides base bias control signal 108 to amplifier 102.

Sense voltage $V_{SENSE}$ is derived as described with reference to FIG. 2 and is applied to one amplifier U4 input terminal. Amplifier U4 acts as a non-inverting amplifier that amplifies around voltage $V_{D2}$ between resistors R9 and R10. To eliminate any voltage differential related to $V_{REF}$ at the inputs of amplifier U4, the ratio of resistor R9 to resistor R10 is made equal to the ratio of resistor R3 to resistor R8 (i.e., R9/R10=R3/R8). Power control voltage $V_{PC}$ then controls the current $I_{SENSE}$ through transistor Q3. Thus, at an equilibrium state base bias signal 108 is a constant DC voltage that is not necessarily zero. Signal 106 provides negative feedback to stabilize $I_{SENSE}$, $V_{SENSE}$, and base bias signal 108 for a particular $V_{PC}$.

An advantage of the circuit shown in FIG. 4 over, for example, the circuit shown in FIG. 3 is that fewer circuit elements are required. However, the voltage $V_{PC}$ source (not shown) may be required to source considerable current, depending on the size of transistor Q3.

Figure 5:
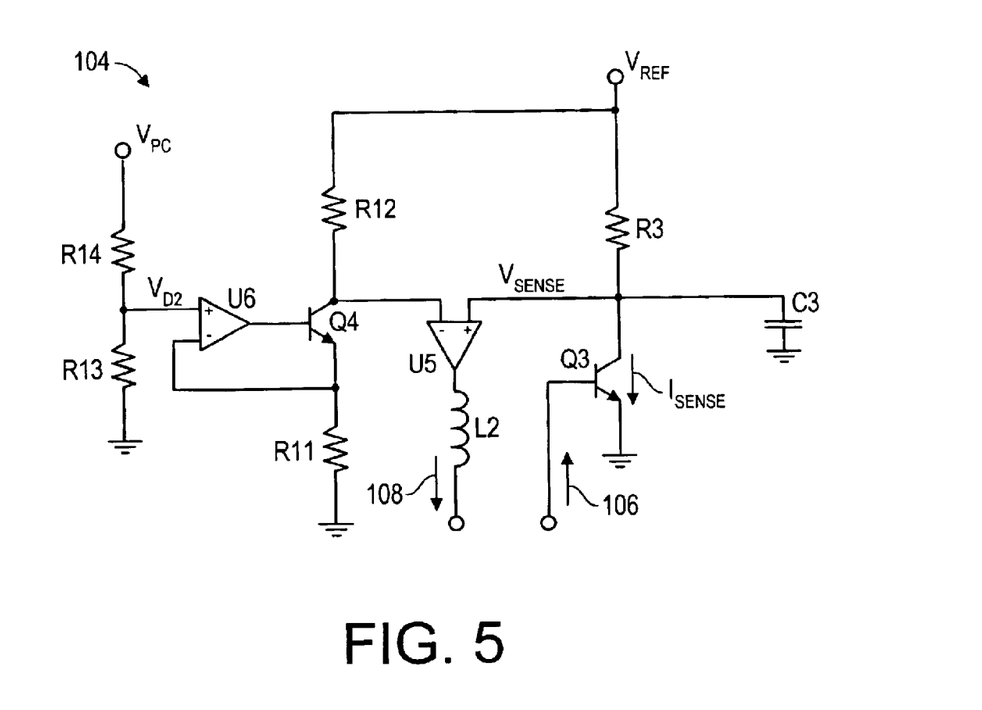
FIG. 5 is a schematic view showing an electrical circuit of a fourth power control circuit embodiment.

FIG. 5 is a schematic view showing an electrical circuit of a fourth power control circuit 104 embodiment, in which the signal $RF_{OUT}$ current is independent of voltage $V_{REF}$. The embodiments shown in FIGS. 3 and 4 depend on resistor ratios to make base bias control signal 108 (and hence amplifier 102 output power) independent of voltage $V_{REF}$. The circuit shown in FIG. 5 does not depend on resistor ratios for voltage $V_{REF}$ independence. As shown in FIG. 5, the base terminal of sense transistor Q3 is coupled to a base terminal of an amplifier 202 transistor as described with reference to FIG. 2. The emitter of transistor Q3 is coupled to ground. The collector of transistor Q3 is coupled to ground via capacitor C3, to the reference voltage source via resistor R3, and to the non-inverting input of error amplifier U5. FIG. 5 further shows npn transistor Q4 having a collector terminal coupled to the inverting input of amplifier U5 and to the reference voltage source via resistor R12. The emitter terminal of transistor Q4 is coupled to ground via resistor R11 and the inverting input of error amplifier U6. The base terminal of transistor Q4 is coupled to the output of amplifier U6. Resistors R13 and R14 are coupled in series between power control voltage $V_{PC}$ and ground. The non-inverting input of amplifier U6 is coupled to the voltage dividing node between resistors R13 and R14.

Sense voltage $V_{SENSE}$ is derived as described with reference to FIG. 2 and is applied to the non-inverting input terminal of amplifier U5. Voltage $V_{D2}$ is a voltage-divided $V_{PC}$ and is input to the non-inverting input terminal of amplifier U6. Amplifier U6 adjusts the base bias of transistor Q4 such that the emitter voltage of transistor Q4 is approximately equal to voltage $V_{D2}$. The combined transistor Q4 and amplifier U6 current passing through resistor R11 is much greater than the current output by amplifier U6. Therefore, excess current is not drawn at the non-inverting input of amplifier U6 and will not lower voltage $V_{D2}$. The transistor Q4 collector current causes a voltage across resistor R12 which is compared with $V_{SENSE}$. Since voltage $V_{REF}$ is common to both inputs of error amplifier U5, the output of amplifier U5 is independent of changes in $V_{REF}$. As voltage $V_{PC}$ is changed, the current through resistor R12 changes. Due to the negative feedback loop with amplifier 102, the current through resistor R3 changes as the current through resistor R12 changes. Thus the voltage $V_{PC}$ value controls the output power of amplifier 102.

The following TABLE I shows illustrative values of selected elements in the accompanying drawings. The values shown are not limiting.

TABLE I

| COMPONENT | VALUE | COMPONENT | VALUE |
|---|---|---|---|
| Resistor R1 | 150 | Capacitor C1 | 1.2 pF |
| Resistor R2 | 150 | Capacitor C2 | 1.2 pF |
| Resistor R3 | 265 | Capacitor C3 | 30 pF |
| Resistor R4 | 10 k | | |
| Resistor R5 | 38 k | Inductor L1 | 3 nH |
| Resistor R6 | 10 k | Inductor L2 | 5 nH |
| Resistor R7 | 38 k | | |

TABLE I-continued

| COMPONENT | VALUE | COMPONENT | VALUE |
|---|---|---|---|
| Resistor R8 | 1 k | $V_{REF}$ | 2.8 V |
| Resistor R9 | 7.95 k | $V_{PC}$ | 0 V to 2.8 V |
| Resistor R10 | 30 k | | |
| Resistor R11 | 10 k | | |
| Resistor R12 | 30 k | | |
| Resistor R13 | 4 k | | |
| Resistor R14 | 38 k | | |

Figure 6:
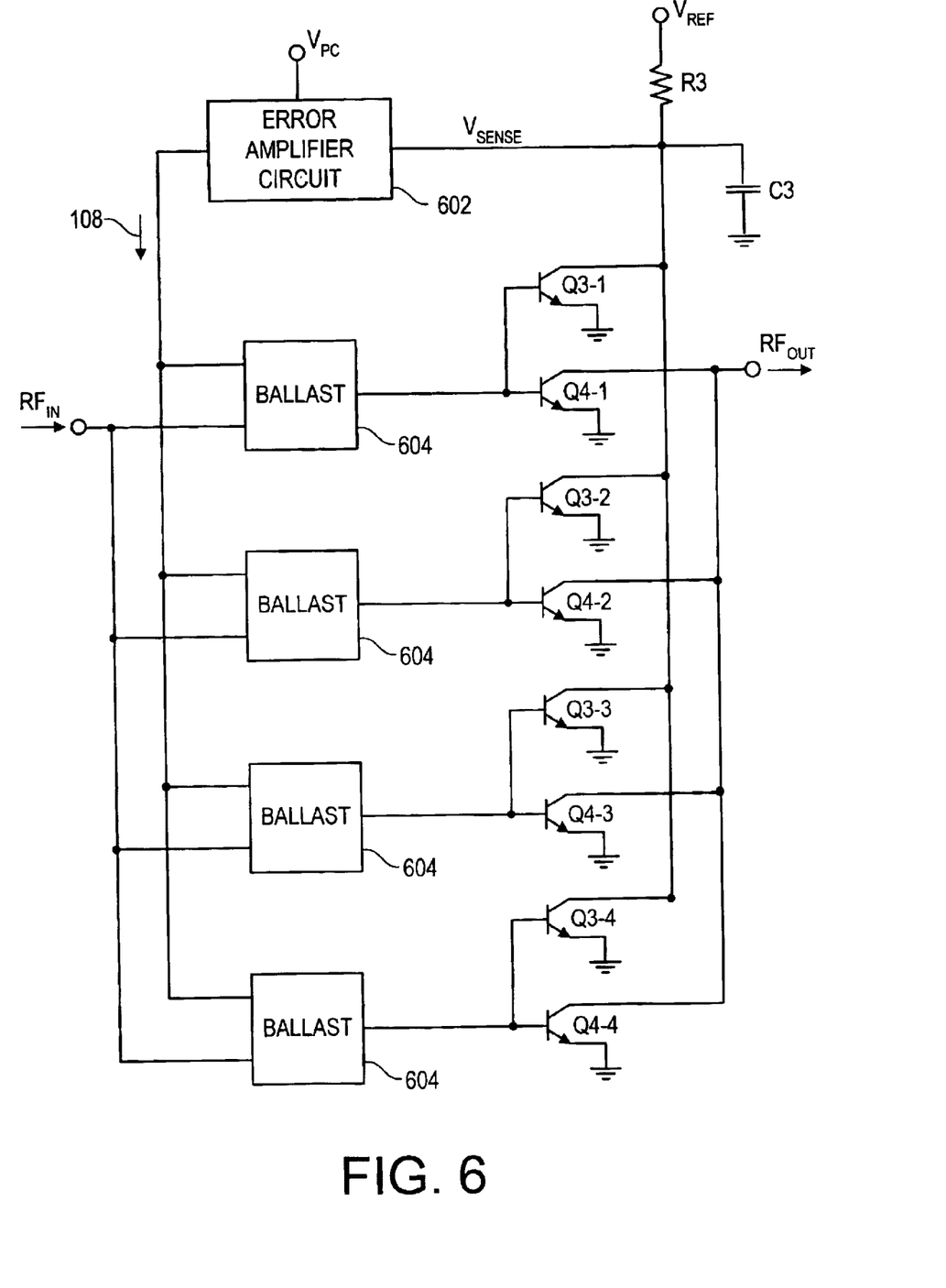
FIG. 6 is a schematic view showing an electrical circuit using multiple sense transistors.

Embodiments of power control circuit 104 (FIG. 1), such as those illustrated by the circuits shown in FIGS. 2–5, can be implemented using multiple sense transistors. As shown in FIG. 6, for example, the base of each amplifying transistor Q4-1,Q4-2,Q4-3,Q4-4 is coupled to the base of a corresponding sense transistor Q3-1,Q3-2,Q3-3,Q3-4. The collectors of the sense transistors are coupled together and provide voltage $V_{SENSE}$ to error amplifier circuit 602, which also receives voltage $V_{PC}$ and includes error amplifiers in configurations such as those shown in FIGS. 2–5. Error amplifier circuit 602 outputs control signal 108 to the base terminals of each amplifying transistor Q4 via ballast circuit 604, which can be as shown by circuit 204 (in which case ballast circuits 604 each receive signals 108 and $RF_{IN}$ at a common node) or by other ballast circuit embodiments (in which case ballast circuit 604 can each receive signals 108 and $RF_{IN}$ at a common node or at separate nodes). The use of four amplifying transistors Q4 is illustrative, and any number n (e.g., 16) can be used.

Figure 7:
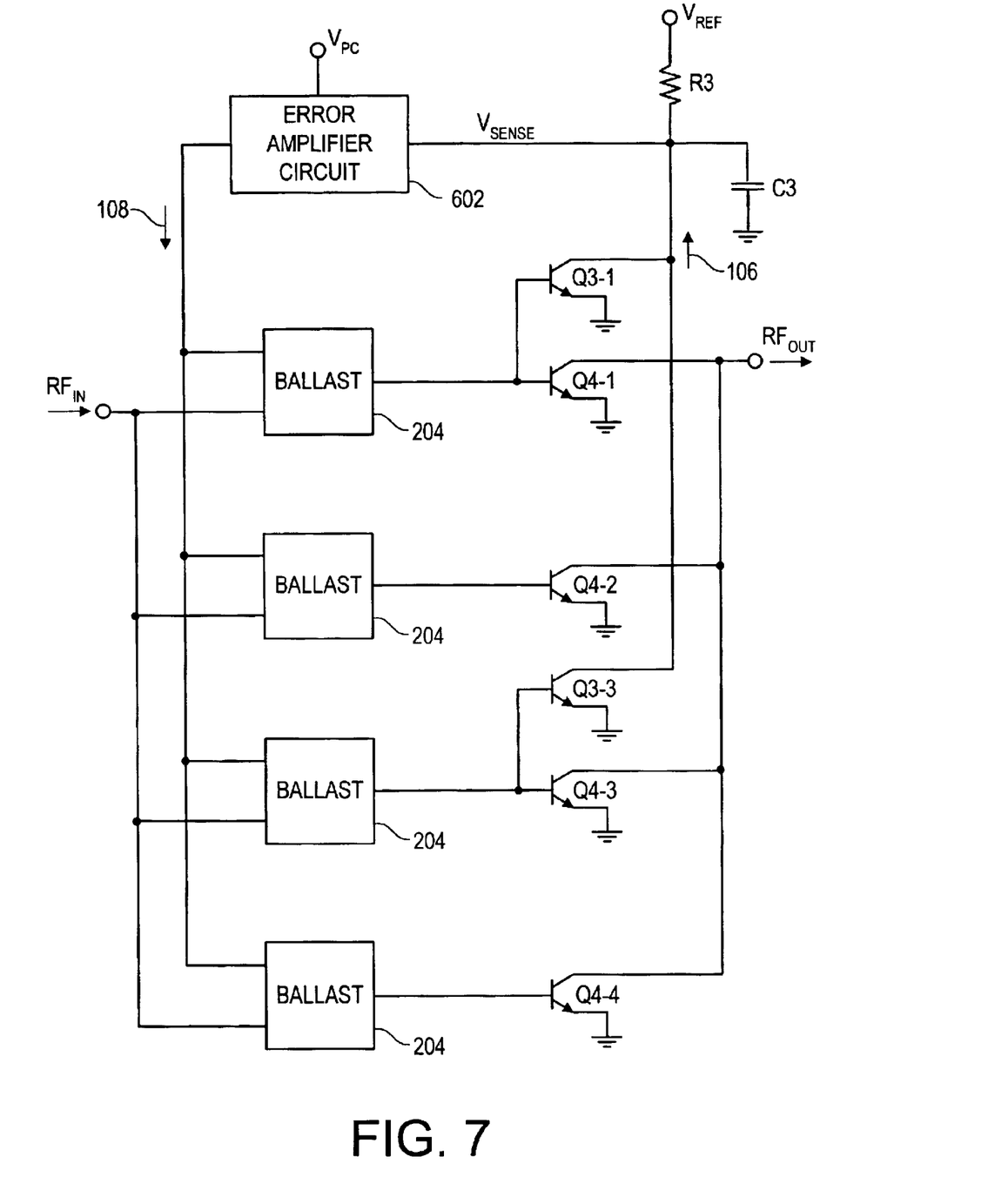
FIG. 7 is a schematic view showing a second electrical circuit using multiple sense transistors.

Each sense transistor Q3-n is physically located close to its corresponding amplifying transistor Q4-n. An advantage of this layout is that subtle temperature variations in each amplifying transistor cause sense current variations in each corresponding sense transistor. Thus, the combined sense currents from each sense transistor generate a voltage $V_{SENSE}$ that more precisely indicates the condition of the amplifying transistors. In some situations, however, it may not be necessary to sample the base current of each amplifying transistor. For example, FIG. 7 illustrates a circuit in which only a selected number of amplifying transistors have a corresponding sense transistor. Various amplifying transistors Q4-n are selected to be paired with a sense transistor Q3-n. For example, every second or every fourth amplifying transistor is paired with a corresponding sense transistor. As another example, amplifying transistors most likely to suffer thermal problems (e.g., transistors located farthest from an edge of the chip) are paired with a corresponding sense transistor.

The invention has been illustrated using several specific embodiments. Skilled individuals will understand, however, that many variations, modifications, and substitutions may be made to these specific embodiments. Therefore, the invention is limited only by the following claims.

We claim:

1. An electrical circuit comprising:
a plurality of amplifying transistors, wherein each unique amplifying transistor comprises a base terminal and a collector terminal, and wherein the collector terminals of each unique amplifying transistor are coupled together; and
a power control circuit, wherein the power control circuit comprises:
a plurality of sense transistors, wherein each unique sense transistor comprises a base terminal and a collector terminal, wherein the base terminal of each unique sense transistor is coupled to the base terminal of a unique corresponding amplifying transistor, and wherein the collector terminals of the sense transistors are coupled together; and
an error amplifier circuit, wherein the error amplifier circuit is coupled to receive a sense voltage from the collector terminals of the sense transistors, and is coupled to output a bias control signal to the base terminals of the amplifying transistors.

2. The circuit of claim 1, wherein the error amplifier circuit comprises an error amplifier, wherein the error amplifier comprises a first input terminal coupled to the collectors of the sense transistors, a second input terminal coupled to a power control voltage source, and an output terminal coupled to output the bias control signal.

3. The circuit of claim 1, wherein the error amplifier circuit comprises:
a first error amplifier comprising a first input terminal, a second input terminal, and an output terminal, wherein the first input terminal of the first error amplifier is coupled to the collectors of the sense transistors, and the output terminal of the first error amplifier is coupled to the base terminals of the amplifying transistors;
a second error amplifier comprising a first input terminal, a second input terminal, and an output terminal, wherein the first input terminal of the second error amplifier is coupled to the output terminal of the second error amplifier via a first resistor, the first input terminal of the second error amplifier is coupled to a control voltage source via a second resistor, and the output terminal of the second error amplifier is coupled to the second input terminal of the first error amplifier; and
a third resistor and a fourth resistor coupled in series between the reference voltage source and the ground, wherein the second input terminal of the second error amplifier is coupled to a node between the third and the fourth resistors, and wherein the ratio of the resistance of the third resistor to the resistance of the fourth resistor is about equal to the ratio of the resistance of the first resistor to the resistance of the second resistor.

4. The circuit of claim 1, wherein the collectors of the sense transistors are coupled to a reference voltage source via a first resistor, and wherein the error amplifier circuit comprises:
an error amplifier comprising a first input terminal, a second input terminal, and an output terminal, wherein the first input terminal is coupled to the collectors of the sense transistors, the first input terminal is coupled to a control voltage source via a second resistor, and the output terminal of the error amplifier is coupled to the base terminals of the amplifying transistors; and
a third resistor and a fourth resistor coupled in series between the reference voltage source and a ground, wherein the second input of the error amplifier is coupled to a node between the third and the fourth resistors, and wherein the ratio of the resistance of the first resistor to a resistance of the second resistor is about equal to the ratio of the resistance of the third resistor to a resistance of the fourth resistor.

5. The circuit of claim 1, wherein the error amplifier circuit comprises:
a first error amplifier comprising a first input terminal, a second input terminal, and an output terminal, wherein the first input terminal of the first error amplifier is coupled to the collectors of the sense transistors, and the output terminal of the first error amplifier is coupled to the base terminals of the amplifying transistors;

a current source transistor comprising a base terminal, an emitter terminal, and a collector terminal, wherein the emitter terminal of the current source transistor is coupled to a ground via a first resistor, the collector terminal of the current source transistor is coupled to the reference voltage source via a second resistor, and the collector terminal of the current source transistor is coupled to the second input terminal of the first error amplifier; and a second error amplifier comprising a first input terminal, a second input terminal, and an output terminal, wherein the output terminal of the second error amplifier is coupled to the base of the current source transistor, the first input terminal of the second error amplifier is coupled to the emitter of the current source transistor, and the second input terminal of the second error amplifier is coupled to a control voltage source.

6. The circuit of claim 1, wherein a sense transistor is paired with every second or every fourth amplifying transistor.

7. The circuit of claim 1, wherein the base terminal of each unique amplifying transistor is coupled to the base terminal of a corresponding unique sense transistor.

8. The circuit of claim 7, wherein the error amplifier circuit comprises an error amplifier, wherein the error amplifier comprises a first input terminal coupled to the collectors of the sense transistors, a second input terminal coupled to a power control voltage source, and an output terminal coupled to output the bias control signal.

9. The circuit of claim 7, wherein the error amplifier circuit comprises:

a first error amplifier comprising a first input terminal, a second input terminal, and an output terminal, wherein the first input terminal of the first error amplifier is coupled to the collectors of the sense transistors, and the output terminal of the first error amplifier is coupled to the base terminals of the amplifying transistors;

a second error amplifier comprising a first input terminal, a second input terminal, and an output terminal, wherein the first input terminal of the second error amplifier is coupled to the output terminal of the second error amplifier via a first resistor, the first input terminal of the second error amplifier is coupled to a control voltage source via a second resistor, and the output terminal of the second error amplifier is coupled to the second input terminal of the first error amplifier; and a third resistor and a fourth resistor coupled in series between the reference voltage source and the ground, wherein the second input terminal of the second error amplifier is coupled to a node between the third and the fourth resistors, and wherein the ratio of the resistance of the third resistor to the resistance of the fourth resistor is about equal to the ratio of the resistance of the first resistor to the resistance of the second resistor.

10. The circuit of claim 7, wherein the collectors of the sense transistors are coupled to a reference voltage source via a first resistor, and wherein the error amplifier circuit comprises:

an error amplifier comprising a first input terminal, a second input terminal, and an output terminal, wherein the first input terminal is coupled to the collectors of the sense transistors, the first input terminal is coupled to a control voltage source via a second resistor, and the output terminal of the error amplifier is coupled to the base terminals of the amplifying transistors; and a third resistor and a fourth resistor coupled in series between the reference voltage source and a ground, wherein the second input of the error amplifier is coupled to a node between the third and the fourth resistors, and wherein the ratio of the resistance of the first resistor to a resistance of the second resistor is about equal to the ratio of the resistance of the third resistor to a resistance of the fourth resistor.

11. The circuit of claim 7, wherein the error amplifier circuit comprises:

a first error amplifier comprising a first input terminal, a second input terminal, and an output terminal, wherein the first input terminal of the first error amplifier is coupled to the collectors of the sense transistors, and the output terminal of the first error amplifier is coupled to the base terminals of the amplifying transistors;

a current source transistor comprising a base terminal, an emitter terminal, and a collector terminal, wherein the emitter terminal of the current source transistor is coupled to a ground via a first resistor, the collector terminal of the current source transistor is coupled to the reference voltage source via a second resistor, and the collector terminal of the current source transistor is coupled to the second input terminal of the first error amplifier; and a second error amplifier comprising a first input terminal, a second input terminal, and an output terminal, wherein the output terminal of the second error amplifier is coupled to the base of the current source transistor, the first input terminal of the second error amplifier is coupled to the emitter of the current source transistor, and the second input terminal of the second error amplifier is coupled to a control voltage source.

12. A method for sensing and controlling the power of a signal output by a plurality of amplifying transistors, wherein each unique amplifying transistor comprises a base terminal and a collector terminal, and wherein the collector terminals of the amplifying transistors are coupled together, the method comprising the acts of:

providing a plurality of sense transistors, wherein each unique sense transistor comprises a base terminal and a collector terminal;

forming a plurality of sense and amplifying transistor pairs by coupling the base terminal of each unique sense transistor to the base terminal of an amplifying transistor;

coupling the collector terminals of the sense transistors together;

outputting a sense voltage from the coupled sense transistor collectors to an error amplifier circuit; and outputting a control signal from the error amplifier circuit to the base terminals of the amplifying transistors, wherein the control signal is associated with a difference between a power control voltage and the sense voltage, and wherein the control signal controls the output current of the amplifying transistors.

13. The method of claim 12, wherein the number of sense and amplifying transistors is the same.

14. The method of claim 12, wherein a sense transistor is coupled to every second or every fourth amplifying transistor.

15. The method of claim 12, wherein a sense transistor is coupled to only selected amplifying transistors likely to operate at higher temperatures than remaining amplifying transistors.

16. The method of claim 12 further comprising the act of making the control signal independent of variations in a reference voltage received by the sense transistors.

17. The method of claim 12 further comprising the act of changing the power of the signal output by the amplifying transistors by changing the power control voltage.

18. The method of claim 12 further comprising the act of using an analog to digital converter to set the power control voltage.

19. The method of claim 12, wherein the signal output by the amplifying transistors is a cellular telephone radio frequency signal.

* * * * *